United States Patent [19]

Landt

[11] Patent Number: 4,486,722
[45] Date of Patent: Dec. 4, 1984

[54] PIN DIODE SWITCHED IMPEDANCE MATCHING NETWORK HAVING DIODE DRIVER CIRCUITS TRANSPARENT TO RF POTENTIAL

[75] Inventor: Harvey L. Landt, Cedar Rapids, Iowa

[73] Assignee: Rockwell International Corporation, El Segundo, Calif.

[21] Appl. No.: 349,750

[22] Filed: Feb. 18, 1982

[51] Int. Cl.³ .............................................. H03H 7/40
[52] U.S. Cl. ................................... 333/17 M; 333/32; 307/259
[58] Field of Search ...................... 333/17 M, 32, 103; 334/55, 56; 336/183, 187; 361/270; 323/352, 328, 293, 247; 307/565, 256, 259; 250/206

[56] References Cited

U.S. PATENT DOCUMENTS

| | | | |
|---|---|---|---|
| 3,678,414 | 7/1972 | Hallford | 333/103 X |
| 3,720,888 | 3/1973 | Monuali | 333/103 |
| 3,721,932 | 3/1973 | Fierstien et al. | 336/183 X |
| 3,766,504 | 10/1973 | Yannucci | 336/187 X |
| 3,794,941 | 2/1974 | Templin | 333/17 M |
| 3,931,514 | 1/1976 | Patterson | 250/206 |
| 4,153,887 | 5/1979 | Poppa | 334/56 X |
| 4,186,360 | 1/1980 | Ohashi | 334/55 |
| 4,201,960 | 5/1980 | Skutta et al. | 333/17 M |
| 4,295,107 | 10/1981 | Perlow | 333/32 X |

OTHER PUBLICATIONS

Mar./Apr. 1979 issue of RF Design article entitled "Design with PIN Diodes, Part I" by Gerald Hiller.
May/Jun. 1979 issue of RF Design article entitled "Design with PIN Diodes, Part II", by Gerald Hiller.
Aug. 1979 final technical report No. RADC-TR-7-9-210 entitled "Electronically Tuned UHF Receiver Preselector" by Thomas Swanson released by Rome Air Development Center.

Primary Examiner—Paul L. Gensler
Assistant Examiner—Benny Lee
Attorney, Agent, or Firm—Richard K. Robinson; George A. Montanye; H. Fredrick Hamann

[57] ABSTRACT

A coupler network with pin diode switches receives biasing and control information through a biasing network that is essentially transparent to the RF operation of the coupler network.

20 Claims, 8 Drawing Figures

PIN DIODE SWITCHED IMPEDANCE MATCHING NETWORK HAVING DIODE DRIVER CIRCUITS TRANSPARENT TO RF POTENTIAL

BACKGROUND OF INVENTION

This invention relates to switched networks for radio signals, which are defined as those signals about 500 Kilohertz, and in particular, to Positive-Intrinsic-Negative (PIN) diode switched networks.

PIN diode switched networks such as antenna couplers, variable inductances, and variable capacitances have been hampered in the past by the adverse effects on the radio signal performance of the devices caused by the dc biasing circuitry necessary to control switching of the PIN diodes. An article appearing in the March/April 1979 issue of RF Design entitled, "Design with PIN diodes, Part I", by Gerald Hiller describes the prior art PIN diode application to HF, UHF and microwave circuits. The article was continued in Part II which appeared in the May/June 1979 issue of RF Design magazine and was entitled, "Design with PIN Diodes, Part II", by Gerald Hiller.

In August 1979 the Rome Air Development Center released a final technical report No. RADC-TR-79-210 entitled, "Electronically Tuned UHF Receiver Preselector" by Thomas Swanson. The article discusses in general the applications of PIN diodes as switching elements in UHF circuits, and in particular, UHF circuits such as preselector which essentially serve the same functions by being placed between the receiver and an antenna as an antenna coupler but providing selectivity to the receiver for removing unwanted signals. The article went into great detail evaluating the application of PIN diodes as a means of biasing the tuned circuits necessary to implement the tuning of the preselector.

SUMMARY OF THE INVENTION

A PIN Diode Switched Network has a selectable inductance that includes a binary sequence of switchable inductances. The switchable inductances are controlled by forward biasing or reverse biasing of PIN diodes that are in parallel arrangement with each member of the switchable inductance sequence. Included in the PIN Diode Switched Network is a capacitance network that includes a binary sequence of capacitors that have one end connected to the variable inductances and the other end connected to a PIN diode switch circuit. The PIN diodes, when activated, connect the second end of the capacitors to a common reference potential. The switching of the PIN diodes for both the variable inductance and capacitances is controlled by a driver circuit that either forward or reverse biases the PIN diodes that are incorporated into the switches. The PIN diodes offer, depending on the biasing, either a high or low resistance to radio signals.

There are two embodiments of the variable inductances provided, one of which enables the PIN diode drivers to be held at a constant reference potential such as chassis ground.

It is the objective of this invention to provide a PIN diode switched network that is biased by a dc voltage, the circuitry of which does not adversely affect the radio signal performance of the network.

These and other objectives, features and advantages of the present invention will appear more fully from the following description of the preferred embodiments taken in conjunction with the drawings.

DETAILED DESCRIPTION OF THE PREFERRED EMBODIMENT

Figure 1:
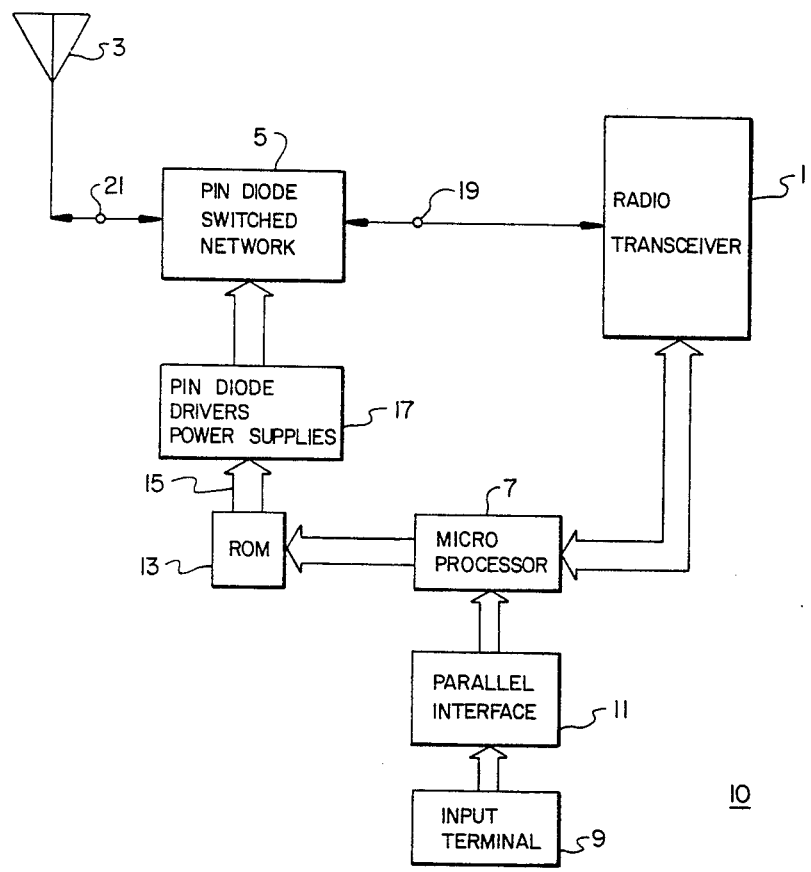
FIG. 1 is a block diagram of a radio transmission system according to the invention.

In FIG. 1, to which reference should now be made, there is shown a radio transmission system 10 that includes a radio transceiver 1 that communicates with other similar transmission systems via electromagnetic waves and an antenna 3. The impedance presented by the antenna 3 for maximum power transfer must be matched to the output impedance of the radio transceiver 1. Therefore, a PIN diode switched network 5 which can be a device such as a tunable vernier, antenna coupler, preselector network, or a preconditioning network is tuned based upon the operating frequency of the radio transceiver 1 so that there is a maximum power transfer at tuned frequency between the antenna 3 and the radio transceiver 1. In modern secure transmission systems that use anti-jam techniques such as frequency hopping it is necessary that PIN diode switches be used to provide rapid tuning. Therefore, the radio transceiver 1 of FIG. 1, for rapid tuning, is controlled by a microprocessor 7 which causes the radio transceiver to be automatically tuned. Manual tuning is provided by an input terminal 9 and a parallel interface 11 which causes, in response to tuning information thereon, the microprocessor to tune the radio transceiver to the desired frequency. Simultaneously with the tuning of the radio transceiver 1, the microprocessor addresses a ROM, (Read Only Memory), which provides on an output bus 15, address lines to the PIN diode drivers 17. The PIN diode drivers 17 tune the PIN diode switched network 5 by causing the PIN diodes contained within the PIN diode switched network 5 to be either forward biased or reverse biased. The biasing of the PIN diodes within the PIN diode switched network 5 will cause tuning of the network by placing inductances in series with the terminals 19 and 21 or between the terminal 19 or 21 and ground. A selected capacitance can also be placed between terminal 19 and/or 21 and ground.

Figure 2:
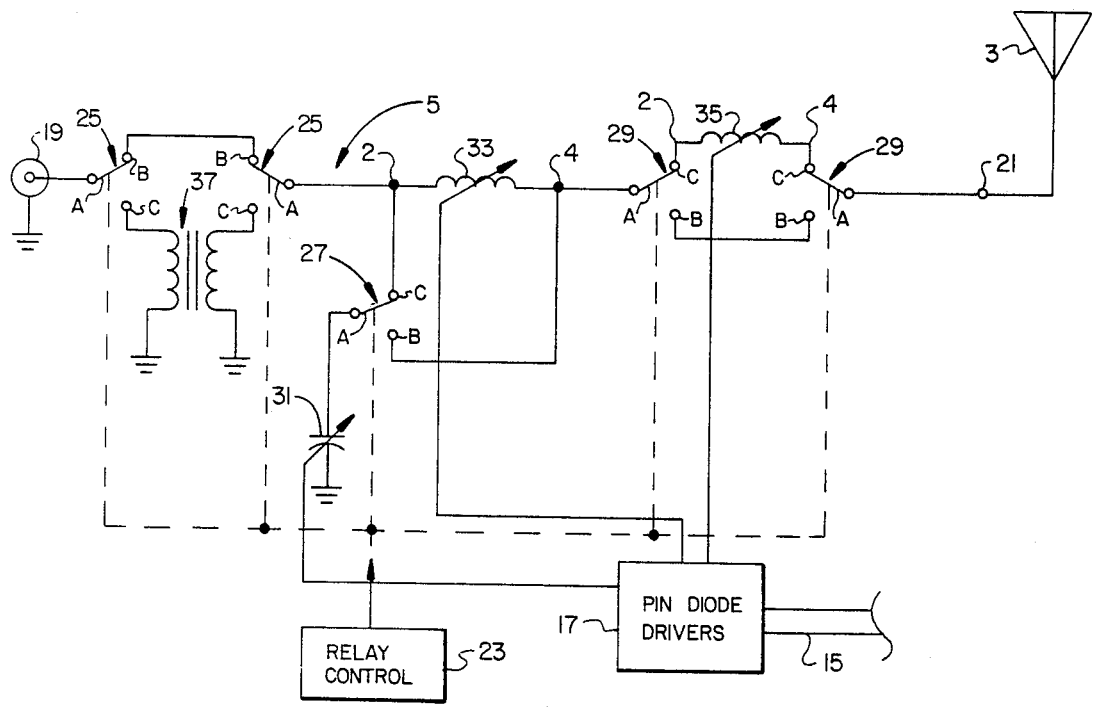
FIG. 2 is a simplified schematic diagram of an antenna impedance matching device according to the invention.

FIG. 2 is a simplified schematic diagram of the PIN diode switched network 5 and includes a coupling transformer 37 for coupling the radio signals from the terminal 19 to the PIN diode switched network 5 when the wiper arms A of the double pole relay 25 are connected to the C terminals. The coupling transformer couples the radio signal that is present at terminal 19 to a first variable inductor 33 which has a variable capacitor 31 connected between an inductance input terminal 2 and a reference potential such as ground. The inductance input terminal 2 is connected to the first variable inductor 33 whose output at the inductance output terminal 4 is connected to a second variable inductor 35 by its input terminal 2 and a relay 29. The output of the second variable inductor 35 is connected to the antenna 3 via the terminal 21. Relay 29 enables the second variable inductor 35 to be bypassed and is controlled by a relay control 23. The capacitance of variable capacitor 31 and the inductances of the first variable inductor 33 and the second variable inductor 35 are controlled by the PIN diode drivers 17 which obtain their commands via parallel data bus 15. The embodiment shown in FIG. 2 provides broad tuning options such that the impedance seen from terminal 19 may be matched to the output impedance seen from terminal 21 by switching in through the relay control 23, different inductances and capacitances. When coupled in the circuit, the impedances, including the first variable inductor 33, the second variable inductor 35, and the variable capacitor 31, may be tuned to a desired impedance by the PIN diode driver 17 under the control of the signals that are present on the parallel data bus 15.

Figure 3:
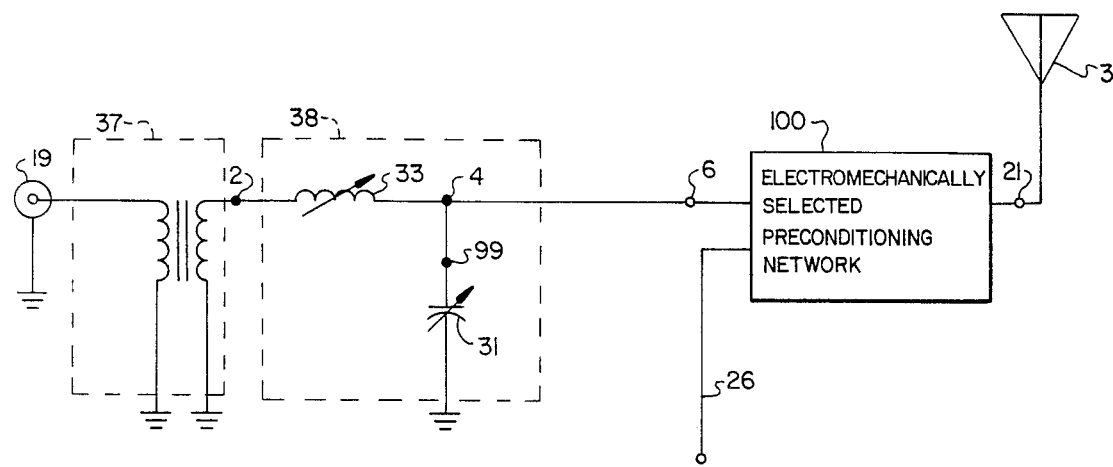
FIG. 3 is a block diagram of a PIN diode switched network used as a vernier control.

For the application where there are a large number of bands over which the radio transceiver 1 of FIG. 1 is able to communicate, it may be desirable to have band tuning performed by an electromechanically selected preconditioned network 100 of FIG. 3. This network includes a number of capacitors and inductors which are activated into the circuit by relay switches. The selection of a desired band is made by the select lines 26 which will cause the electromechanically selected preconditioning network 100 to tune in to the desired impedance that corresponds to that band. In the preferred embodiment the electromechanically selected preconditioning network 100 has a band width of 1 megahertz. Fine tuning is provided by a vernier control 38 that includes a first variable inductor 33 and a variable capacitor 31. Radio signals are conducted to the vernier circuit 38 via the terminal 19 and the coupling transformer 37. The variable capacitor 31 is connected to the inductance output terminal 4 of the first variable inductor 33 at a junction point 99.

Figure 4:
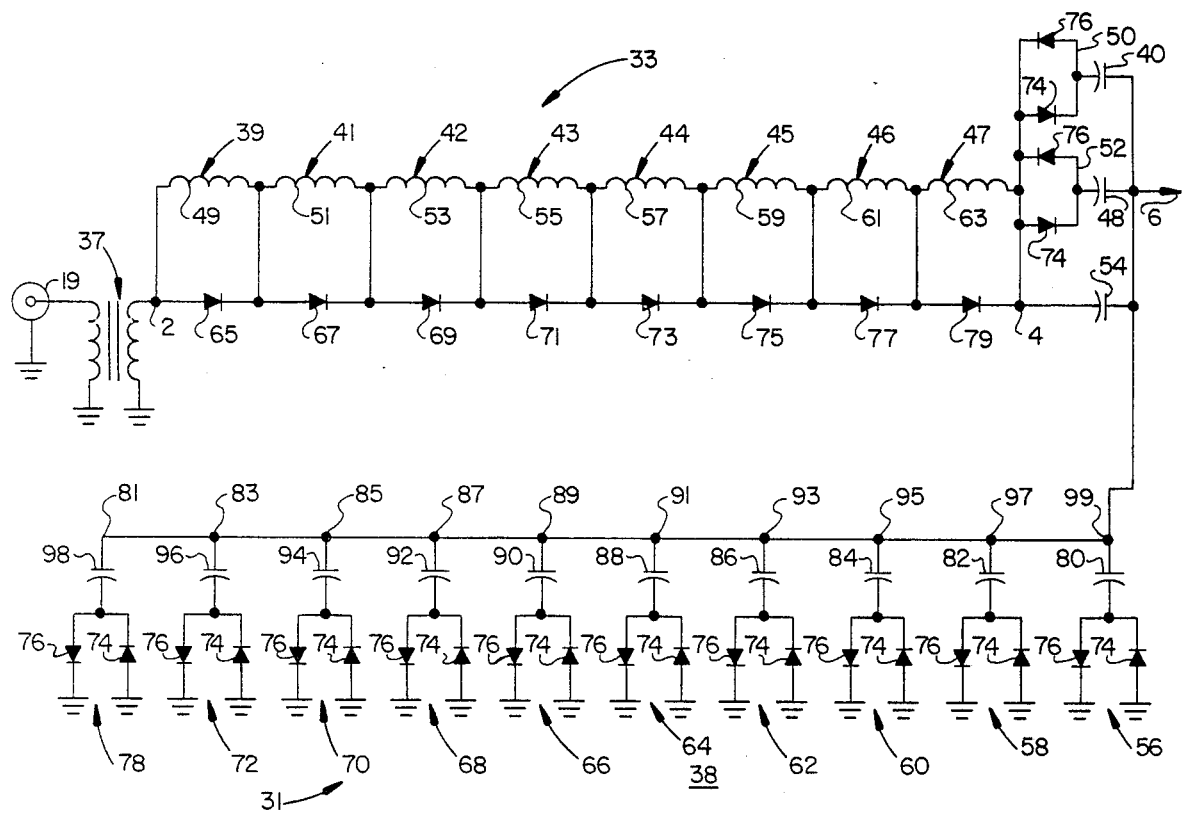
FIG. 4 is a radio frequency schematic diagram of the PIN diode switched network of FIG. 3.

A radio signal schematic diagram, where a radio signal is defined as a signal in the radio frequency range up through the microwave frequency ranges of the vernier circuit 38, is provided in FIG. 4. The variable inductor 33 includes eight inductor positions; eighth position 39, seventh position 41, sixth position 42, fifth position 43, fourth position 44, third position 45, second position 46, and first position 47. The inductance in the first inductance position 47 is provided by an inductor 63 which is connected in the radio signal circuit when the PIN diode 79 is reverse biased. A broad selection of inductances can be achieved by having a binary sequence of inductors in the eight positions. Consequently, the inductance provided by the inductor 61 in the second inductance position 46 is one-half of the inductance provided by the inductor 63. PIN diode 77 either offers a high resistance when it is reverse biased to the RF signal forcing the signal to pass through the inductor 61, or a very low resistance to the RF signal when forward biased, thereby shunting the inductance of the inductor 61. In a similar fashion the inductance of the inductor 59 is one-half of the inductance of the inductor 61 and is switched into the circuit by the PIN diode 75. The inductance of the inductor 57 in the fourth position 44 is one-half the inductance of the inductor 59 and twice as large as the inductance in the fifth inductance position 43 that is provided by the inductor 55. PIN diodes 71 and 73 control the flow of the radio signal current either through the inductors 55, 57 or through the PIN diodes 71, 73 depending on their biasing arrangement. The lowest value of inductance is in the eighth inductance position and it is provided by inductor 49 which is controlled by PIN diode 65. The inductance of the inductor 49 is one-half that of the inductance of the inductor 51 which is in the seventh inductance position 41 and is controlled by the PIN diode 67. The inductance of the inductor 53 located in the sixth inductance position 42 is one-half of the inductance of inductor 55 but is twice as large as the inductance of the inductor 51.

The radio signal may be coupled to ground via the variable capacitance 31 that includes ten capacitance stages. Here again, the capacitance stages are arranged in a binary sequence to provide 1,023 capacitance values. The positions are; a first capacitance position 81, second capacitance position 83, third capacitance position 85, fourth capacitance position 87, fifth capacitance position 89, sixth capacitance position 91, seventh capacitance position 93, eighth capacitance position 95, ninth capacitance position 97, and tenth capacitance position 99. Corresponding to each capacitance position is a PIN diode switching pair that include the diode switching pair 78, 72, 70, 68, 66, 64, 62, 60, 58 and 56.

Each diode switching pair consists of an anode PIN diode 76 and a cathode PIN diode 74. The anode refers to the fact that the anode of the PIN diode 76 is connected to a capacitor that occupies the associated position. Similarly, a cathode PIN diode is so named because the cathode of the cathode PIN diode 74 is connected to the anode PIN diode 76 as well as to one side of the capacitor in the associated position. The capacitor in the first capacitance position through the capacitor in the tenth capacitance positions are capacitors 98, 96, 94, 92, 90, 88, 86, 84, 82, and 80 respectively. As in the case with the inductor, the capacitance increases from position 1 by the doubling of the capacitance of the preceding positions through position 10 which has the highest capacitance value. The radio signal is coupled to an output terminal 6 by the coupling capacitors 40, 48, and 54. Capacitors 40 and 48 are switched capacitors and are controlled by the PIN diode pair 50 and 52, respectively. The biasing of the PIN diodes enables the vernier circuit 38 to provide a broad selection of inductances and capacitance values to either fine tune the electromechanically selected preconditioning network 100 of FIG. 3 or, if in a circuit by itself, to match the impedence that is present on terminal 19 with the impedance that is present on terminal 6.

Figure 5:
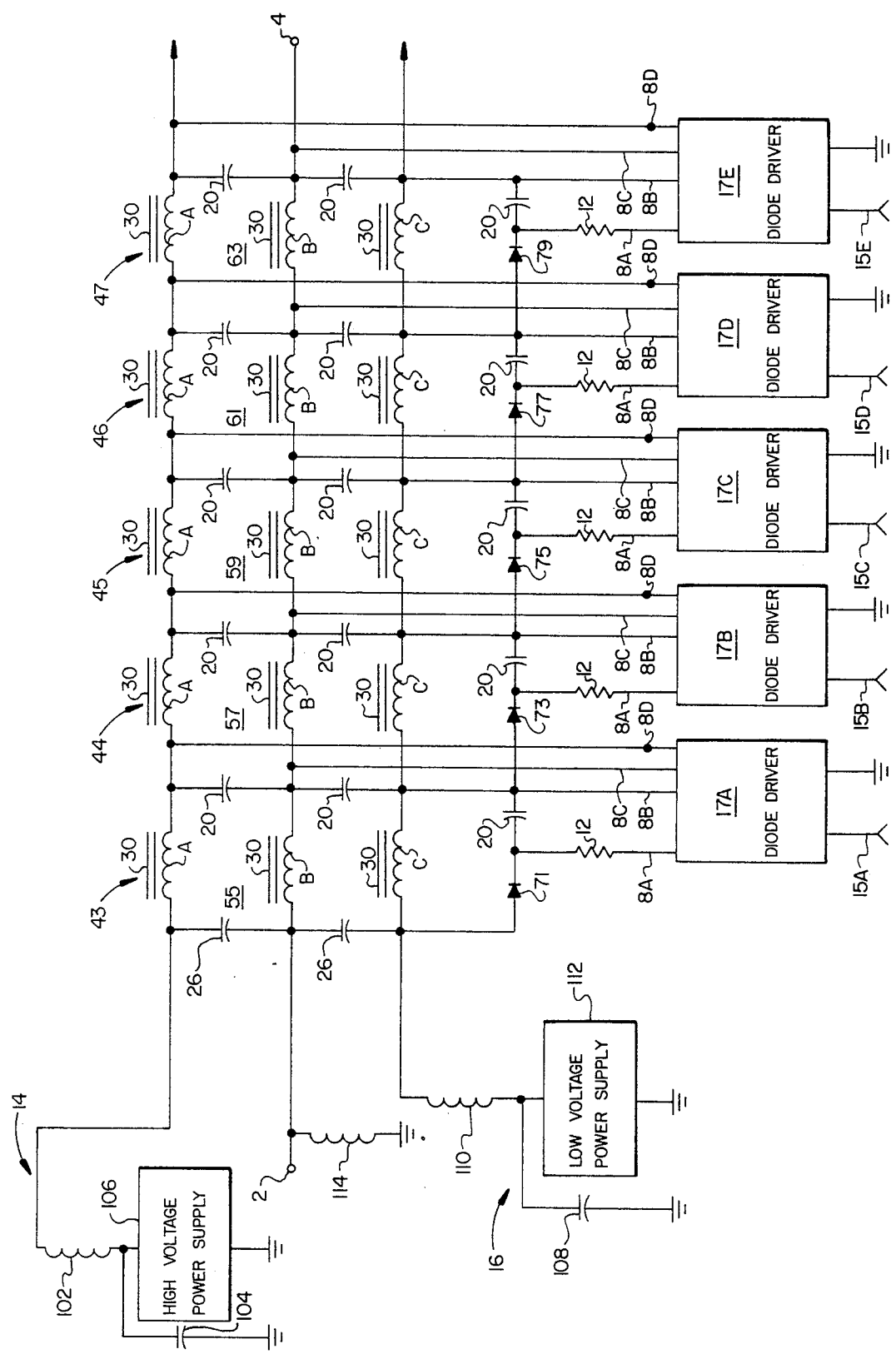
FIG. 5 is a schematic diagram of the variable inductance of the antenna impedance matching device according to the invention.

FIG. 5 is a schematic diagram of the biasing network and the first variable inductor 33 which can also be used on the second variable inductor 35. For simplicity, only five stages of selectable inductances are shown. However, additional stages may be added because each stage is essentially independent. The first inductance position 47 includes an inductor 63 that has three windings A, B, and C. The windings are separated by RF bypass capacitors 20. The A, B, and C windings are made of conductors that are held close together and twisted, or bonded, together to form a multi-conductor cable. The multi-conductor cable is wound into a solenoidal coil of the required inductance. The RF bypass capacitors may be physical capacitors and/or the dielectric wire insulation around the conductors from which the A, B, and C windings are wound. The inductance is determined, of course, as with any coil, by the number of turns; however it may be enhanced by the addition of magnetic materials 30. In the embodiment of FIG. 5 each inductance 55, 57, 59, 61, and 63 is made in the same fashion. Diode drivers 17A, 17B, 17C, 17D, and 17E drive the appropriate PIN diodes 71, 73, 75, 77, and 79 respectively; i.e., diode driver 17E driving PIN diode 79 which is located in the first inductance position 47 and similarly, PIN diode 71, which is located in the fifth inductance position 43, is driven by the diode driver 17A. Conductors 15A through 15E control the biasing of their associated PIN diodes by reverse biasing the appropriate diodes from the high voltage power supply 14 through conductors 8A. Resistor 12 is a current limiting resistor and is used primarily to set the forward biased current of the PIN diode. Forward biasing of the PIN diode is provided by removing through a switch located in the diode driver 17 the high voltage from the high voltage power supply 14 from conductor 8A causing the low voltage from a low voltage power source 16 to forward bias each of the selected PIN diodes.

High voltage biasing for the PIN diodes is provided by the high voltage power source 14 that includes a high voltage power supply 106, a choke coil 102 and a capacitor 104. The choke coil 102 and capacitor 104 provide a path to the reference potential for unwanted alternating current signals including unwanted radio signals.

Forward biasing for the PIN diodes is provided by the low voltage source 16 that includes a low voltage power supply 112, a choke coil 110 and a capacitor 108. The choke coil 110 and capacitor 108, as in the case of the high voltage power source 14, provide a path to ground for unwanted alternating current signals.

Radio signals are applied to the variable inductance by the inductor input terminal 2 and a reference potential return choke coil 114.

Figure 6:
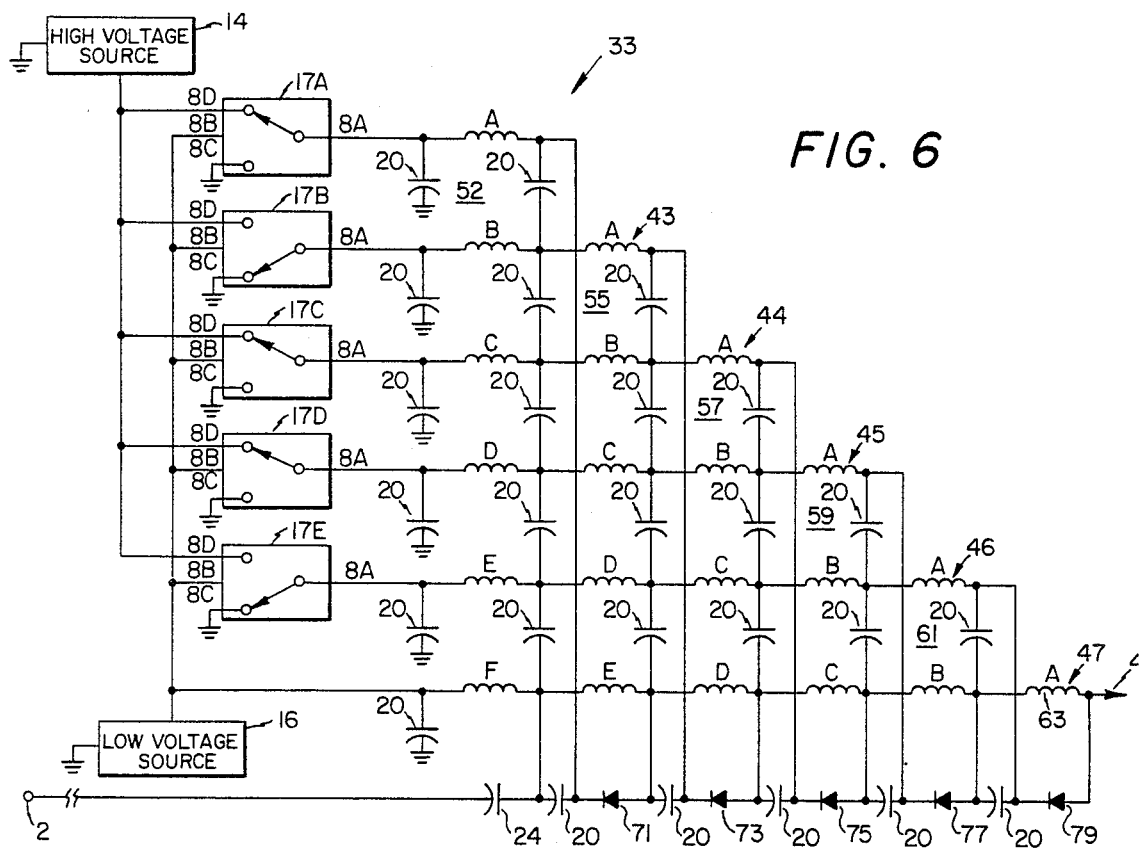
FIG. 6 is a schematic diagram of an alternate embodiment of the variable inductances.

FIG. 6 is a schematic diagram of an alternate embodiment of the variable inductor 33 or the second variable inductor 35 which is identical to the first variable inductor 37 and has the advantage over the embodiment shown in FIG. 5 in that each of the diode drivers 17A through 17E remain at radio signal ground potential. This is accomplished by having the number i, where i is a positive number of mutually wound conductors that are used to create the inductor of each position equal the position number, N, which is also a positive number. For example, the inductor in first inductance position 47 is a single inductor 63 which is switched in and out of the circuit by the PIN diode 79. The second inductance position 46 has two conductors that are wound together to form a coil that comprises the inductor 61 and includes an A and B winding. This process continues with the third position 45 having an A, B, and C winding, the fourth position 44 having an A, B, C, and D winding, to the fifth position 43 wherein there are five conductors that are wound together to form the signal inductor and include the A, B, C, D, and E conductors. In the preferred embodiment as in the embodiment in FIG. 5, the inductances are a binary sequence with the highest inductance being in position 1. The inductance in each position is equal to the inductance in position 1 divided by $2^N$ where N is the position number. Capacitor 24 allows the radio signal to be applied to the first variable inductor 33 while blocking the dc voltage from the low voltage source 16. As shown in FIG. 6, the first variable inductor is configured in the series mode. Bias and control information is provided via feed inductors 52 A through F constructed in the same manner as the component inductors forming the first variable inductor 33. This feed inductor isolates the RF signals flowing from terminal 2 to terminal 4 from ground by providing a high impedance with respect to radio signal ground potential. As shown in this embodiment, if the variable inductor were to be operated in the shunt mode, terminal 2 would be grounded, feed inductor 52 could be eliminated since the driver circuits 17A through 17E would be at the same radio signal ground potential as terminal 2, and the isolating feed inductor would not be required. The diode drivers in the embodiment of FIG. 5 are illustrated as switches which is the essential function that the drivers perform.

Figure 7:
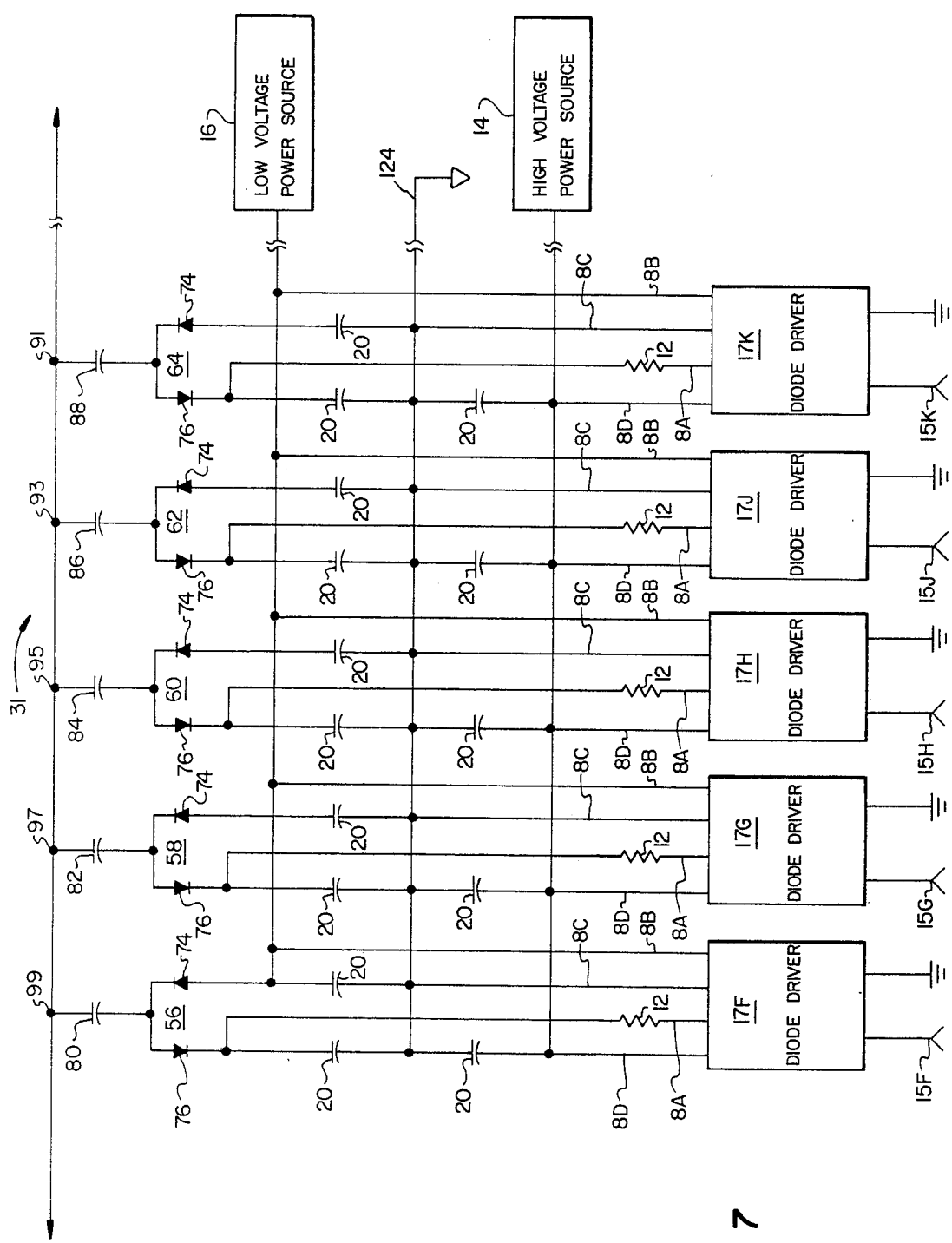
FIG. 7 is a schematic diagram of the variable capacitance of the antenna impedance matching device of FIG. 1.

FIG. 7 is a schematic diagram of the variable capacitor 31 and, as with the inductors, there is provided the RF bypass capacitors 20, a low voltage power source 16, and a high voltage power source 14. The diode drivers 17F, 17G, 17H, 17J, and 17K operate in the same manner as the diode drivers discussed in conjunction with FIGS. 5 and 6. Each PIN diode pair, that includes the anode PIN diode 76 and the cathode PIN diode 74, is biased by coupling the high voltage from the high voltage power source 14 on conductor 8A to the cathode of each anode PIN diode 76. The removal of the high DC voltage and the addition of the low DC voltage will cause the PIN diodes to be forward biased and will allow them to provide a low resistance to the radio signal. It should be noted that the switched coupling capacitors 50 and 48 of FIG. 3 are obtained by serially connecting the inductor output terminal of FIGS. 5 and 6 to the capacitor terminal 124 of FIG. 7. Of course for the embodiment shown in FIG. 3, the PIN diode switched network need only be a three stage network. The use of the PIN diode pair provides an essentially perfect switch by providing an extremely high resistance when reverse biased and a very low resistance when forward biased.

Figure 8:
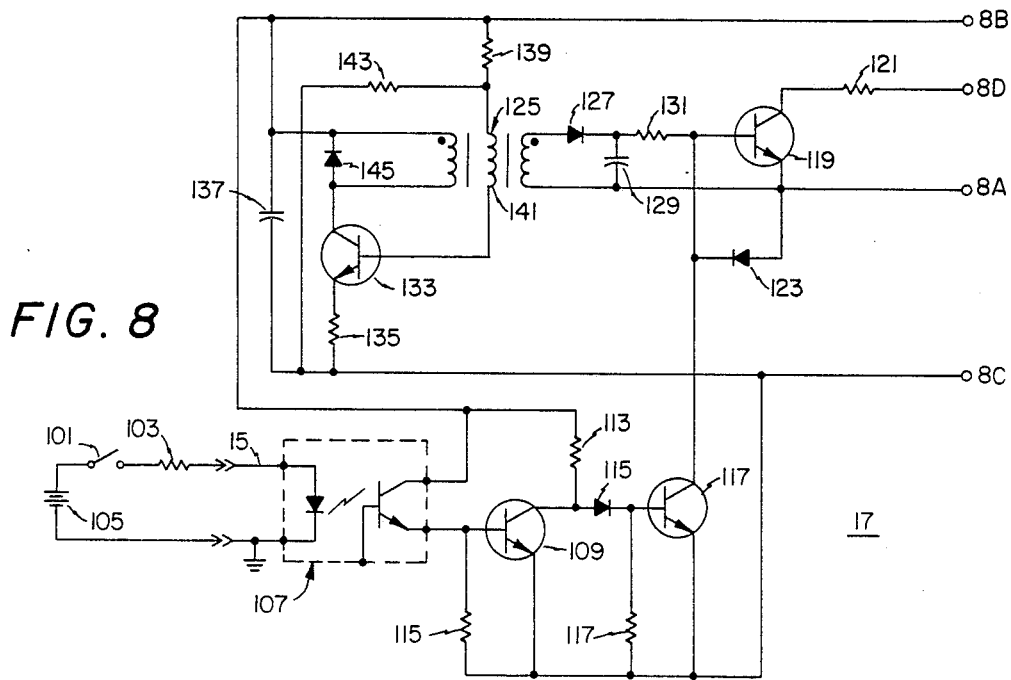
FIG. 8 is a schematic diagram of a PIN diode drivers that control the biasing of the PIN diodes used to select the variable inductances and capacitances.

FIG. 8 is a schematic diagram of the PIN diode drivers 17 and illustrates an optical coupler 107 which is energized by connecting a positive voltage source 105 to the light emitting diode contained within the optical coupler 107. Switch 101 represents the interface, such as from the ROM 13 and microprocessor 7, that drives the PIN diode drivers and when closed causes the current from the power supply 105 to flow through the current limiting resistor 103 through conductor 15 to the optical coupler 107. When the optical coupler 107 is turned on, the transistor switch 109 is forward biased by the current flowing through the optical coupler transistor causing transistor 109 to go into saturation, essentially connecting its collector and emitter together and consequently to the common potential that is present on terminal 8C. When the transistor 109 is turned on, transistor 117 becomes reverse biased and turns off. Under normal, nonselected conditions, the transistor 117 is biased on by the current flow from terminal 8A which in FIGS. 5, 6 and 7 is connected to the low voltage power source through the associated PIN diode or diode pair. However, when transistor 109 is turned on, transistor 117 turns off and causes transistor 119 to become forward biased and turned on. This allows the voltage from the high voltage power source 14 to be conducted from terminal 8D through resistor 121 and transistor 119 to terminal 8A. When the switch 101 is opened, transistor 117 turns on causing the transistor 119 to become reverse biased and removing the high voltage that is present on terminal 8D from terminal 8A. The switching action of the transistor switch 119 is controlled by a floating supply that includes the transformer 125 and the transistor 133. A change in state of transistor 117 causes diode 123 to gate the floating supply to the base of transistor 119 causing it to change states also. Transformer 125 and transistor 133 form a blocking oscillator circuit. The output of the blocking oscillator is rectified by diode 127 and filtered by capacitor 129. Base drive current into transistor 119 is controlled by the value of resistor 131. The floating power supply isolates the base circuit of switching transistor 119 from the high voltage provided by the high voltage source 14 while enabling switched states to be applied by diode 123 in conjunction with transistor 117.

Many changes and modifications in the above described embodiment of the invention can, of course, be carried out without departing from the scope thereof. Accordingly, the scope is intended to be limited only by the scope of the appended claims.

I claim:

1. An impedance network comprising:
   first means for providing an impedance including at least one selectable impedance portion which may be individually selected to vary said impedance; and
   second means coupled to said first means for selecting said individual selectable impedance portion to vary said impedance and including at least one PIN diode, a first voltage source, a second voltage source having a voltage higher than said first voltage source and means for coupling said first voltage source and said second voltage source to said PIN diode to selectively forward bias and reverse bias said PIN diode, respectively, in such a manner that there is no direct radio frequency path to radio frequency ground potential through resistive or reactive impedances of said means for coupling and said voltage sources for controlling said impedance portion to vary the selectable impedance in such a manner that said means for coupling and said voltage sources are transparent to a radio frequency potential applied through said impedance.

2. The network of claim 1 wherein said at least one selectable impedance portion is a plurality of inductors connected in electrical series to form said first means and said at least one PIN diode is a plurality of PIN diodes, each coupled in electrical parallel with a different one of said inductors.

3. The network of claim 1 wherein said at least one selectable impedance portion is a plurality of capacitors connected in electrical parallel to form said first means and said at least one PIN diode comprises a plurality of pairs of PIN diodes, each pair being coupled such that the anode of one PIN diode is coupled to the cathode of the other PIN diode and the junction forming the coupling between the diode pair is coupled in series with a separate one of said capacitors.

4. The network of claim 1 wherein said means for coupling comprises:
   means for providing a switching signal;
   means for providing a light output in response to said switching signal; and
   means responsive to said light output for controlling said first and second voltage source to selectively forward and reverse bias said PIN diode.

5. The network of claim 1 wherein said at least one selectable impedance portion is an inductor and said inductor is formed by a plurality of interwound insulated conductors.

6. The network of claim 5 wherein said plurality of insulated conductors comprises three conductors interwound to form a solenoid coil of a preselected number of turns.

7. The network of claim 6 wherein the winding of said insulated conductors in said solenoid coil is constructed and arranged to produce a capacitance between each of the conductors of the solenoid.

8. A radio frequency impedance switching network comprising:
   first means for providing an impedance including at least one selectable impedance portion which may be individually selected to vary said impedance and arranged to form an input and output;
   second means for coupling a source of radio frequency potential to said input; and
   third means coupled to said first means for selecting said individual selectable impedance portion to vary said impedance and including at least one PIN diode, a first voltage source, a second voltage source having a voltage higher than said first voltage source, and means for coupling said first voltage source and said second voltage source to said PIN diode to selectively forward bias and reverse bias said PIN diode, respectively, in such a manner that there is no direct radio frequency path to radio frequency ground potential through resistive or reactive impedances of said means for coupling and said voltage sources for controlling said selectable impedance portion to vary the impedance in such a manner that said means for coupling and said voltage sources are transparent to said radio frequency potential.

9. The network of claim 8 wherein said at least one selectable impedance portion is a plurality of inductors connected in electrical series to form said first means and said at least one PIN diode is a plurality of PIN diodes, each coupled in electrical parallel with a different one of said inductors.

10. The network of claim 8 wherein said at least one selectable impedance portion is a plurality of capacitors connected in electrical parallel to form said first means and said at least one PIN diode comprises a plurality of pairs of PIN diodes, each pair being coupled such that the anode of one PIN diode is coupled to the cathode of the other PIN diode and the junction forming the coupling between the diode pair is coupled in series with a separate one of said capacitors.

11. The network of claim 8 wherein said means for coupling comprises:
   means for providing a switching signal;
   means for providing a light output in response to said switching signal; and
   means responsive to said light output for controlling said first and second voltage source to selectively forward and reverse bias said PIN diode.

12. The network of claim 8 wherein said at least one selectable impedance portion is an inductor and said inductor is formed by a plurality of interwound insulated conductors.

13. The network of claim 12 wherein said plurality of insulated conductors comprises three conductors interwound to form a solenoid coil of a preselected number of turns.

14. The network of claim 13 wherein the winding of said insulated conductors in said solenoid coil is constructed and arranged to produce a capacitance between each of the conductors of the solenoid.

15. The system of claim 8 wherein said at least one selectable impedance portion comprises an inductance portion and a capacitance portion, and said at least one PIN diode comprises a PIN diode coupled in parallel with said inductance portion to selectively short said inductance portion and a PIN diode pair coupled in series with said capacitance portion to selectively short said capacitance portion to ground potential.

16. An impedance network comprising:
   first means for providing an impedance including at least one selectable impedance portion which may be individually selected to vary said impedance, said at least one selectable impedance portion comprising N inductors, where N is an integer and each inductor is identified by a separate number from 1 to N, each inductor being formed by a number of interwound insulated conductors, wherein the number of insulated conductors is equal to the number identifying the inductor; and
   second means coupled to said first means for selecting said individual selectable impedance portion to vary said impedance and including at least one PIN diode, a first voltage source, a second voltage source having a voltage higher than said first voltage source, and means for coupling said first voltage source and said second voltage source to said PIN diode to selectively forward bias and reverse bias said PIN diode, respectively, for controlling said impedance portion to vary the selectable impedance.

17. The network of claim 16 wherein said interwound insulated conductors are formed as a solenoid coil such that a capacitance is formed between each of said conductors.

18. A radio frequency impedance switching network comprising:
   first means for providing an impedance including at least one selectable impedance portion which may be individually selected to vary said impedance and arranged to form an input and output, said at least one selectable impedance portion comprising N inductors, wherein N is an integer and each inductor is identified by a separate number from 1 to N, each inductor being formed by a number of interwound insulated conductors, wherein the number of insulated conductors is equal to the number identifying the inductor;
   second means for coupling a source of radio frequency potential to said input; and
   third means coupled to said first means for selecting said individual selectable impedance portion to vary said impedance and including at least one PIN diode, a first voltage source, a second voltage source having a voltage higher than said first voltage source, and means for coupling said first voltage source and said second voltage source to said PIN diode to selectively forward bias and reverse bias said PIN diode, respectively, for controlling said selectable impedance portion to vary the impedance.

19. The network of claim 18 wherein said interwound insulated conductors are formed as a solenoid coil such that a capacitance is formed between each of said conductors.

20. The network of claim 19 wherein said capacitance is a radio frequency bypass capacitance.

* * * * *